United States Patent
Vanhoff

(10) Patent No.: US 9,628,730 B2
(45) Date of Patent: Apr. 18, 2017

(54) DARK CURRENT GRADIENT ESTIMATION USING OPTICALLY BLACK PIXELS

(71) Applicant: SEMICONDUCTOR COMPONENTS INDUSTRIES, LLC, Phoenix, AZ (US)

(72) Inventor: Barry Vanhoff, Corvallis, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 81 days.

(21) Appl. No.: 14/606,562

(22) Filed: Jan. 27, 2015

(65) Prior Publication Data

US 2016/0219231 A1    Jul. 28, 2016

(51) Int. Cl.
| | |
|---|---|
| *H04N 5/361* | (2011.01) |
| *H04N 5/225* | (2006.01) |
| *H04N 5/365* | (2011.01) |
| *H04N 9/04* | (2006.01) |
| *H01L 27/146* | (2006.01) |

(52) U.S. Cl.
CPC ....... *H04N 5/361* (2013.01); *H01L 27/14607* (2013.01); *H04N 5/2257* (2013.01); *H04N 5/365* (2013.01); *H04N 9/045* (2013.01); *H04N 2209/045* (2013.01)

(58) Field of Classification Search
CPC ...................................................... H04N 5/361
USPC .......................................................... 348/243
See application file for complete search history.

(56) References Cited

U.S. PATENT DOCUMENTS

| | | |
|---|---|---|
| 5,272,536 A | 12/1993 | Sudo et al. |
| 5,521,639 A | 5/1996 | Tomura et al. |
| 6,101,287 A | 8/2000 | Corum et al. |
| 6,607,301 B1 | 8/2003 | Glukhovsky et al. |
| 6,714,241 B2 | 3/2004 | Baer |
| 6,744,526 B2 | 6/2004 | McDermott et al. |
| 7,639,291 B2 | 12/2009 | Lim et al. |
| 8,228,402 B2 | 7/2012 | Egawa |
| 8,463,068 B2 | 6/2013 | Hunter |
| 2004/0091046 A1* | 5/2004 | Akimoto ................ H04N 7/014 375/240.12 |

(Continued)

OTHER PUBLICATIONS

Beck et al., U.S. Appl. No. 14/566,393, filed Dec. 10, 2014.

(Continued)

*Primary Examiner* — Roberto Velez
*Assistant Examiner* — Cynthia Segura
(74) *Attorney, Agent, or Firm* — Treyz Law Group, P.C.; Kendall W. Abbasi; Joseph F. Guihan

(57) ABSTRACT

A method for removing background signal values from readout signal values generated by image pixels in a pixel array may include generating background signal values using optically black pixels formed around a border of the pixel array. The background signal values may be separated into blocks. Block average values may be calculated based on the background signal values included in each of the blocks. Corner regions of the pixel array may be free of image pixels and optically black pixels. Corner background signal values may be extrapolated based on the block average values. Image pixel background signal values may be interpolated based on the block average values and the corner background signal values. The image pixel background signal values may be subtracted from the readout values.

18 Claims, 6 Drawing Sheets

(56) References Cited

U.S. PATENT DOCUMENTS

| | | | |
|---|---|---|---|
| 2009/0167908 A1* | 7/2009 | Mori | A61B 1/00009 348/251 |
| 2013/0027592 A1* | 1/2013 | Sugiura | H04N 5/378 348/243 |
| 2013/0135298 A1* | 5/2013 | Isogai | G06T 15/205 345/419 |
| 2014/0313375 A1 | 10/2014 | Mlinar | |
| 2015/0304578 A1* | 10/2015 | Okura | H04N 5/374 348/308 |
| 2016/0173794 A1* | 6/2016 | Beck | H04N 5/361 348/244 |

OTHER PUBLICATIONS

"Coons patch", Wikipedia, Jan. 23, 2014 (Jan. 23, 2014), Retrieved from the Internet: URL: <http://en.wikipedia.org/wiki/Coons_patch> [retrieved on Jan. 21, 2015].

\* cited by examiner

DARK CURRENT GRADIENT ESTIMATION USING OPTICALLY BLACK PIXELS

BACKGROUND

This relates to solid-state image sensor arrays and, more particularly, to image sensors with optically black pixels for compensating for dark current and electrical non-uniformities generated by image sensors.

Image sensors are commonly used in electronic devices such as cellular telephones, cameras, and computers to capture images. In a typical arrangement, an electronic device is provided with an array of image pixels. The image pixels generate image signals in multiple color channels in response to light that is received at the image sensor. Readout circuitry such as analog-to-digital converter circuits are commonly coupled to the image pixels for reading out image signals from the image pixels.

The image pixels in an image sensor may generate signals even when no light is incident upon the image sensor (i.e., image pixels may generate a background signal). Signals that are generated in the absence of incident light may cause noise (i.e., fixed pattern noise) in the image signals generated by the sensor in response to light that is received at the image sensor. Noise generated by the image pixels in an image sensor may reduce the sensitivity of the image sensor and result in an image having undesirable brightness, color, and contrast characteristics.

In an image sensor, the temperature of the image sensor substrate typically affects the image signals generated by the image pixels. In a typical pixel photodiode, there is some current (i.e., dark current) in the photodiode even when no light is incident upon the photodiode (due to the inherent movement of electrons across the corresponding semiconductor junction). As the temperature of the photodiode increases, this flow of electrons, and therefore the dark current, increases. Increased dark current in the image sensor can cause excessive and unsightly noise in the final image signal.

Image pixels in different locations on a pixel array may generate different levels of dark current and background noise. For example, because the level of dark current generated by a photodiode is temperature-dependent, image pixels that are located in a portion of a pixel array that has a higher temperature (i.e., near image sensor circuitry that generates heat) may have a higher temperature and generate more dark current or noise than image pixels that are in an area of the pixel array with a lower temperature. The temperature may vary across an image sensor to form a temperature gradient. Likewise, the level of dark current and/or noise present in the signals generated by pixels located in different locations in the pixel array may form a gradient based on the location of the image pixels in the array. It is therefore useful to be able to determine the level of dark current and noise produced by the image pixels in the image sensor array so that dark current contributions to the final image signal can be compensated for.

One method of compensating for dark current and noise generated by the pixels in an image sensor array involves replacing a conventional an image sensor pixel with a "dummy" pixel that only produces a dark current signal and does not produce a photocurrent signal (i.e., an image signal generated in response to light received at the pixel). This dark current signal may be used to generate a correction value that can be used to correct for the dark current produced by the normal image sensor pixels in the vicinity of the dummy pixel. However, this method of dark current compensation requires knocking out pixels in the active portion of the image sensor array, and may result in images having dead pixels and low resolution. If the resolution of the image sensor is to be maintained, only a limited number of image sensor pixels may be knocked out. However, this leads to limited locations at which the dark current/noise contributions of the image pixels in the array can be sensed, and results in correction values that may not be able to provide accurate dark current compensation values for all pixels in the array (e.g., for pixels that are not located near a dummy pixel).

It would therefore be desirable to provide imaging devices with improved systems and methods for compensating for dark current and electrical non-uniformities in image signals generated by image sensors.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to herein as image pixels). The image pixels in the image sensors may include photosensitive elements such as photodiodes that convert the incoming light into image signals. Image sensors may have any number of pixels (e.g., hundreds, thousands, millions or more). A typical image sensor may, for example, have hundreds of thousands or millions of pixels (e.g., megapixels). Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
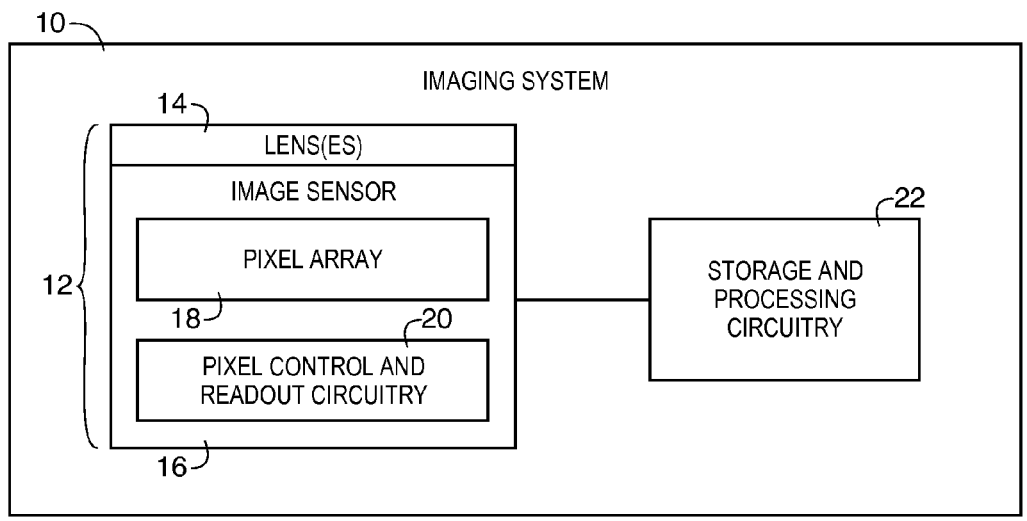
FIG. 1 is a block diagram of an illustrative electronic device having an imaging system with an image sensor and processing circuitry in accordance with an embodiment of the present invention.

FIG. 1 is a diagram of an illustrative imaging system that uses an image sensor to capture images. Electronic device 10 (sometimes referred to herein as imaging system 10 or system 10) of FIG. 1 may be a portable electronic device such as a camera, a cellular telephone, a video camera, or other imaging device that captures digital image data. Camera module 12 (sometimes referred to herein as module 12) may be used to convert incoming light into digital image data. Camera module 12 may include one or more lenses 14 and image sensor circuitry 16 (e.g., one or more corresponding image sensors). Image sensor circuitry 16 (sometimes referred to herein as image sensor 16 or sensor 16) may include an array of image pixels 18 (sometimes referred to herein as array 18, pixel array 18, image sensor pixel array 18, or image pixel array 18) and pixel control and readout circuitry 20 (sometimes referred to herein as pixel readout circuitry 20, pixel readout and processing circuitry 20, or processing circuitry 20). During image capture operations, light from a scene may be focused onto image sensor pixel array 18 by lens 14. Image sensor 16 may include any number of pixel arrays 18 (e.g., one pixel array, two pixel arrays, ten pixel arrays, etc.). If desired, camera module 12 may be provided with an array of lenses 14 and an array of corresponding image sensors 16.

Image pixels in pixel array 18 may generate image signals in response to receiving light from a scene. For example, image sensor pixels in array 18 may include photosensitive elements such as photodiodes that convert incoming light into electric charge. Image pixels may generate background signals (e.g., signals due to dark current and/or noise generated by the photosensitive elements or other components of image pixels). The signal generated by an image pixel may have an image signal component (i.e., a signal generated in response to light incident upon the image pixel) and a background signal component (i.e., a signal generated due to dark current or noise generated by the image pixel).

Image pixels in pixel array 18 may be controlled using pixel control and readout circuitry 20. Pixel control and readout circuitry 20 may include any desired pixel control and/or readout circuitry (e.g., row control circuitry, column read out circuitry, etc.). Pixel control and readout circuitry 20 may include circuitry for converting analog image signals into corresponding digital image data (e.g., a respective pixel value generated by each image pixel). Pixel values generated by pixel array 18 and pixel control and readout circuitry 20 may be provided to storage and processing circuitry 22 (sometimes referred to herein as processing circuitry 22). Image data may be captured in frames by image sensor 16.

If desired, pixel array 18 may include optically black pixels. Optically black pixels may be used for estimating background signal values produced by pixels (such as image pixels) in a pixel array 18. For example, optically black pixels may include image sensor pixels in which a portion of an image sensor pixel has been modified. In one illustrative example, optically black pixels may be image pixels that have been modified such that the optically black pixels are not exposed to light incident upon the pixel array and that do not convert incoming light into electric charge. Optically black sensor pixels may produce signals in response to dark current (e.g., OB pixels may not produce a photocurrent or may only produce dark current). Optically black pixels may be formed by forming layer of material that does not transmit light over the photodiode (e.g., an opaque material). A layer of material that prevents optically black pixels form receiving light may be a layer of aluminum or any other suitable material.

Optically black pixels in array 18 may produce signals that only include background signals due to dark current or noise generated by the optically black pixels. The signals produced by optically black pixels may be optically black pixel background signals that are representative of the background signal (e.g., dark current and noise) generated by the optically black pixel on a portion of pixel array 18. These background signals may be used to generate background signal compensation values for image pixels. If desired, pixel control and readout circuitry 20 may include background signal processing circuitry for performing background signal compensation operations on digital image pixel signals generated by image pixels in pixel array 18 based on the background signals generated by the optically black pixels.

Image sensor 16 may receive control signals from storage and processing circuitry 22 and may supply pixel data to storage and processing circuitry 22. Storage and processing circuitry 22 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using storage and processing circuitry 22. Processed image data may, if desired, be provided to external equipment (e.g., a computer or other device) using wired and/or wireless communications paths coupled to storage and processing circuitry 22.

Figure 2:
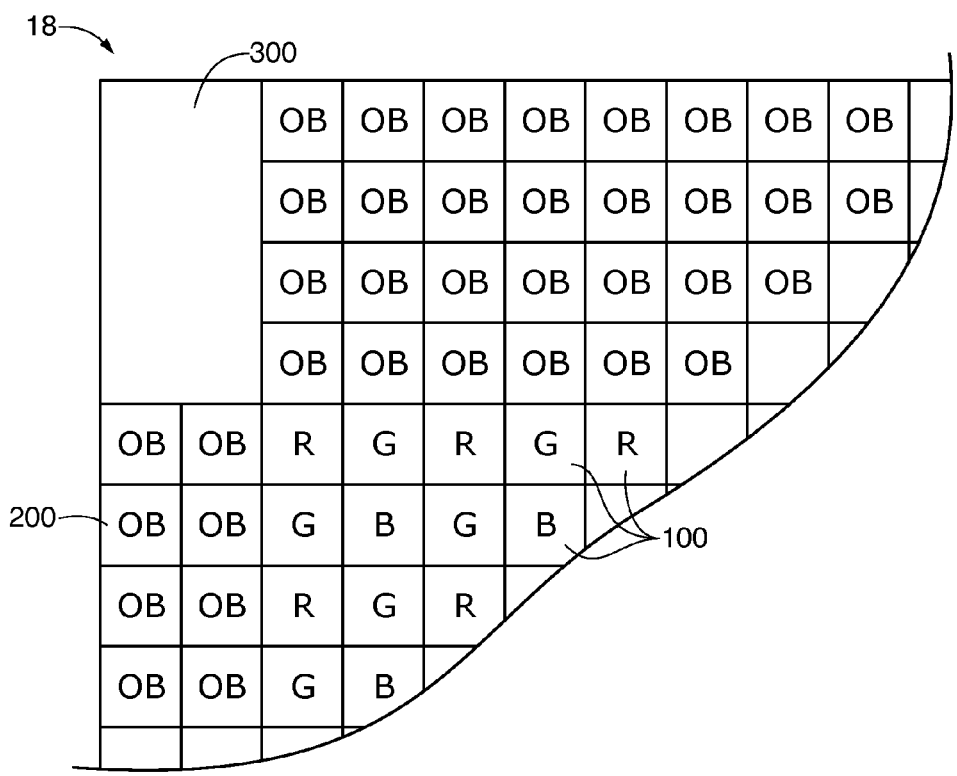
FIG. 2 is a diagram of an illustrative pixel array having image pixels and optically black pixels in accordance with an embodiment of the present invention.

A portion of an illustrative pixel array such as pixel array 18 of FIG. 1 is shown in FIG. 2. Array 18 may contain, for example, hundreds or thousands of rows and columns of image pixels 100 (sometimes referred to herein as image sensor pixels 100 or pixels 100). Image pixels 100 may be covered by a color filter array that includes color filter elements over some or all of image pixels 24. Color filter elements for image pixels 100 may be red color filter elements (e.g., photoresistive material that passes red light while reflecting and/or absorbing other colors of light), blue color filter elements (e.g., photoresistive material that passes blue light while reflecting and/or absorbing other colors of light), green color filter elements (e.g., photoresistive material that passes green light while reflecting and/or absorbing other colors of light), clear color filter elements (e.g., transparent material that passes red, blue and green light), yellow color filter elements, or any other desired color filter elements. As shown in the illustrative example of FIG. 2, image pixels 100 may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. Such an array may be able to detect the wavelength and intensity of light received at pixel array 18 using image pixels 100. This, however, is merely illustrative. Image pixels 100 may be formed in pixel array 18 in any suitable arrangement, pattern, or configuration.

Array 18 may include one or more pixels such as optically black pixels 200 (sometimes referred to herein as OB pixels 200). For example, array 18 may contain optically black pixels 200 arranged around the border (periphery) of array 18. In such an arrangement, the border formed by optically black pixels may be one pixel wide, two pixels wide, ten pixels wide, or may have a width corresponding to any other suitable number of pixels. In the illustrative example of FIG. 2, pixel array 18 is provided with border of optically black pixels 200 having a width of two pixels along one edge, and a border of optically black pixels 200 having a width of four pixels along another edge. This, however, is merely illustrative. Optically black pixels 200 may be positioned in any suitable location on pixel array 18. For example, optically black pixels 200 may be positioned randomly throughout array 18, along one side or more than one side of array 18, or in the middle of array 18 (e.g., optically black pixels 200 may be formed from or may replace image pixels 100 in array 18).

Array 18 may include one or more regions that do not contain any pixels such as region 300 (sometimes referred to herein as corner 300 or corner region 300). Region 300 may not contain any image pixels 100 or optically black pixels 200. In one illustrative example, region 300 may contain traces that are coupled to pixel array 18. For example, region 300 may be used to route wires, traces, or other circuitry components of pixel array 18 to other components of image sensor 16, such as pixel control and readout circuitry 20. As shown in the illustrative example of FIG. 2, region 300 may be formed in a corner portion of pixel array 18. In one illustrative example, pixel array 18 may have four corners, and a region 300 that does not contain any pixels may be formed in each of the four corners of pixel array 18. This, however, is merely illustrative. Pixel array 18 may be provided with any number of regions 300 that do not include pixels positioned in any suitable location on pixel array 18 and may or may not include wires, traces, or other circuitry coupled to pixel array 18 or other components of image sensor 16. In one suitable scenario, pixel array 18 may not be provided with any regions 300. For example, region 300 of pixel array 18 shown in FIG. 2 may include pixels such as image pixels 100 or optically black pixels 200.

As discussed above in connection with FIG. 1, image pixels 100 may receive light that is incident upon pixel array 18. Image pixels 100 may contain photosensitive elements that generate electrical signals in response to the light that is received thereon. These electrical signals may be converted into digital image pixel signal values by analog-to-digital converter circuitry (which may be contained in pixel control and readout circuitry 20 or storage and processing circuitry 22, for example). Image pixels 100 may generate electrical signals that are not generated in response to light that is received at pixel array 18 (e.g., image pixels 100 may generate background signals). These background signals may be converted into digital image pixel background signal values 102 (sometimes referred to herein as image pixel background signal values 102, background signals 102, image pixel background signal value estimates 102, background signal value estimates 102, background signal estimates 102, estimates 102, or background signal values 102) by analog-to-digital converter circuitry (which may be contained in pixel control and readout circuitry 20 or storage and processing circuitry 22, for example). The digital image pixel readout value generated by an image pixel 100 may therefore include both a digital image pixel signal value component and a digital image pixel background signal value component due to the image signals generated in response to the light received upon pixel array 18 and the background signal generated by the image pixel 100 (e.g., due to dark current generated by image pixel 100), respectively. The digital image pixel readout values generated by image pixels 100 may therefore include unwanted background signals and noise that may lower the quality of the final image produced.

Optically black pixels 200 may generate background signals in response to dark current and electrical noise generated by optically black pixels 200. As described above in connection with FIG. 1, optically black pixels 200 may be configured such that optically black pixels 200 only generate background signals. Background signals generated by optically black pixels 200 may be converted into digital optically black pixel background signal values 202 (sometimes referred to herein as optically black pixel background signal values 202, background signals 202, or background signal values 202) by analog-to-digital converter circuitry (which may be contained in pixel control and readout circuitry 20 or storage and processing circuitry 22, for example). Because optically black pixels 200 may only generate background signals, the digital optically black pixel readout values generated by optically black pixels 200 may only include digital optically black background signal values that represent the background signal generated by the optically black pixels 200 (due to, for example, dark current and noise in optically black pixels 200).

Figure 3:
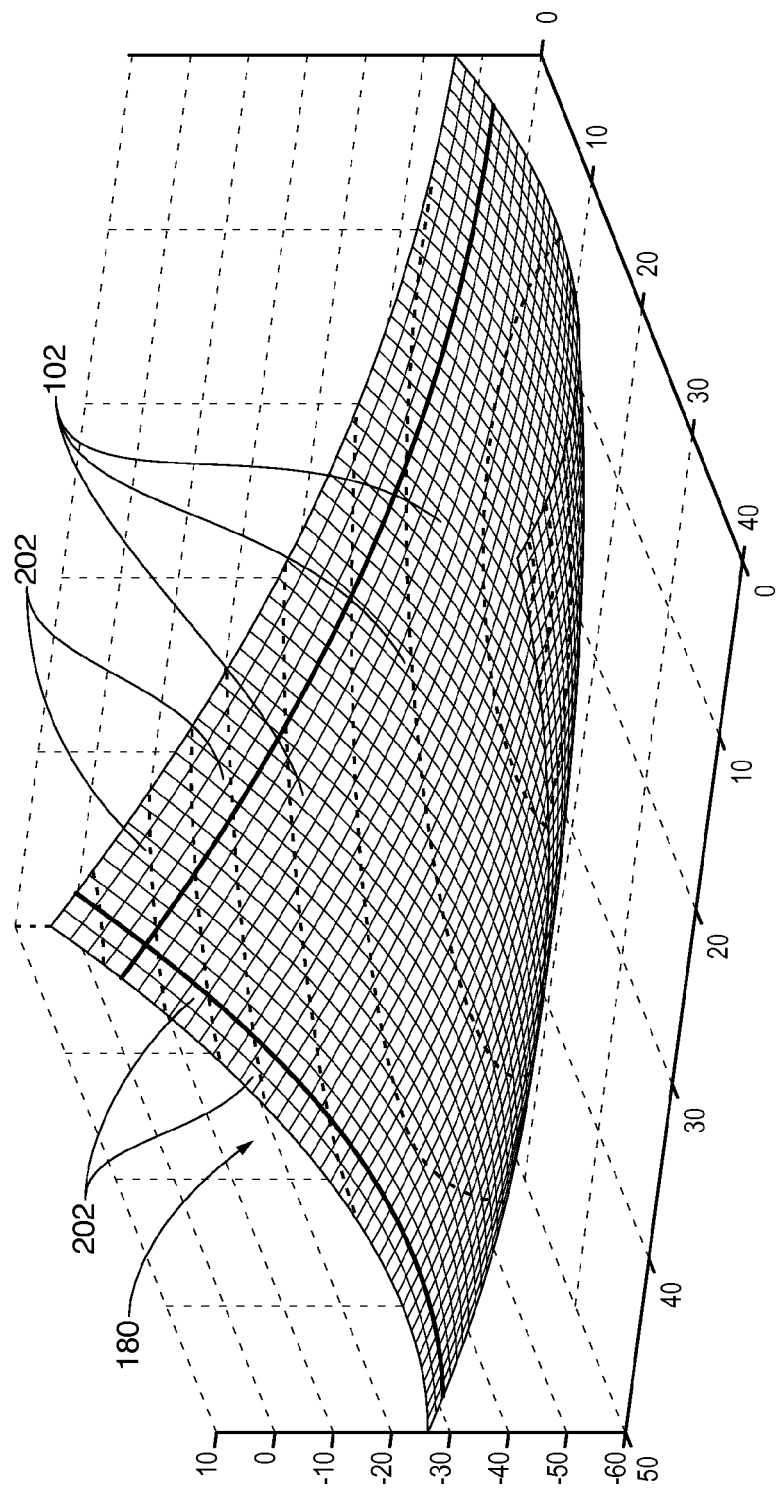
FIG. 3 is a diagram of illustrative background signal gradient that may represent background signal values generated by the image pixels and optically black pixels in a pixel array such as the pixel array of FIG. 2 in accordance with an embodiment of the present invention.

FIG. 3 is a diagram of a gradient 180 (sometimes referred to herein as background signal gradient 180 or signal gradient 180) of background signal values that may be generated by image pixels 100 and optically black pixels 200 in pixel array 18. Gradient 180 may include background signal values 102. Background signal values 102 may be background signal values generated by image pixels 100. Background signal values 102 be generated as a result of dark current or noise generated by image pixels 100 and may be a component of the digital image pixel readout values generated by image pixels 100 in array 18. Other components of the digital image pixel readout values generated by image pixels 100 may include digital image pixel signal values that are generated in response to light that is received at image pixels 100 and converted into an electrical signal by a photosensitive element (e.g., a photodiode).

Gradient 180 may include background signal values 202. Background signal values 202 may be generated by optically black pixels 200 in pixel array 18. Background signals values 202 may be the only signal values generated by optically black pixels 200 (e.g., optically black pixels 200 may not receive any light and may not generate photocurrent.

In the illustrative example of FIG. 3, background signal values 102 may not be initially known. For example, because the digital image pixel signal values generated by image pixels 100 include at least both an image pixel signal value component and a background signal value component that are outputted as a single value (i.e., the readout value), the contributions of each component may be unknown. In order to compensate for the background signal that is included in the signal outputted by an image pixel 100 (in addition to the image pixel signal, for example), it may be desirable to estimate the background signal value generated by an image pixel 100.

Figure 4:
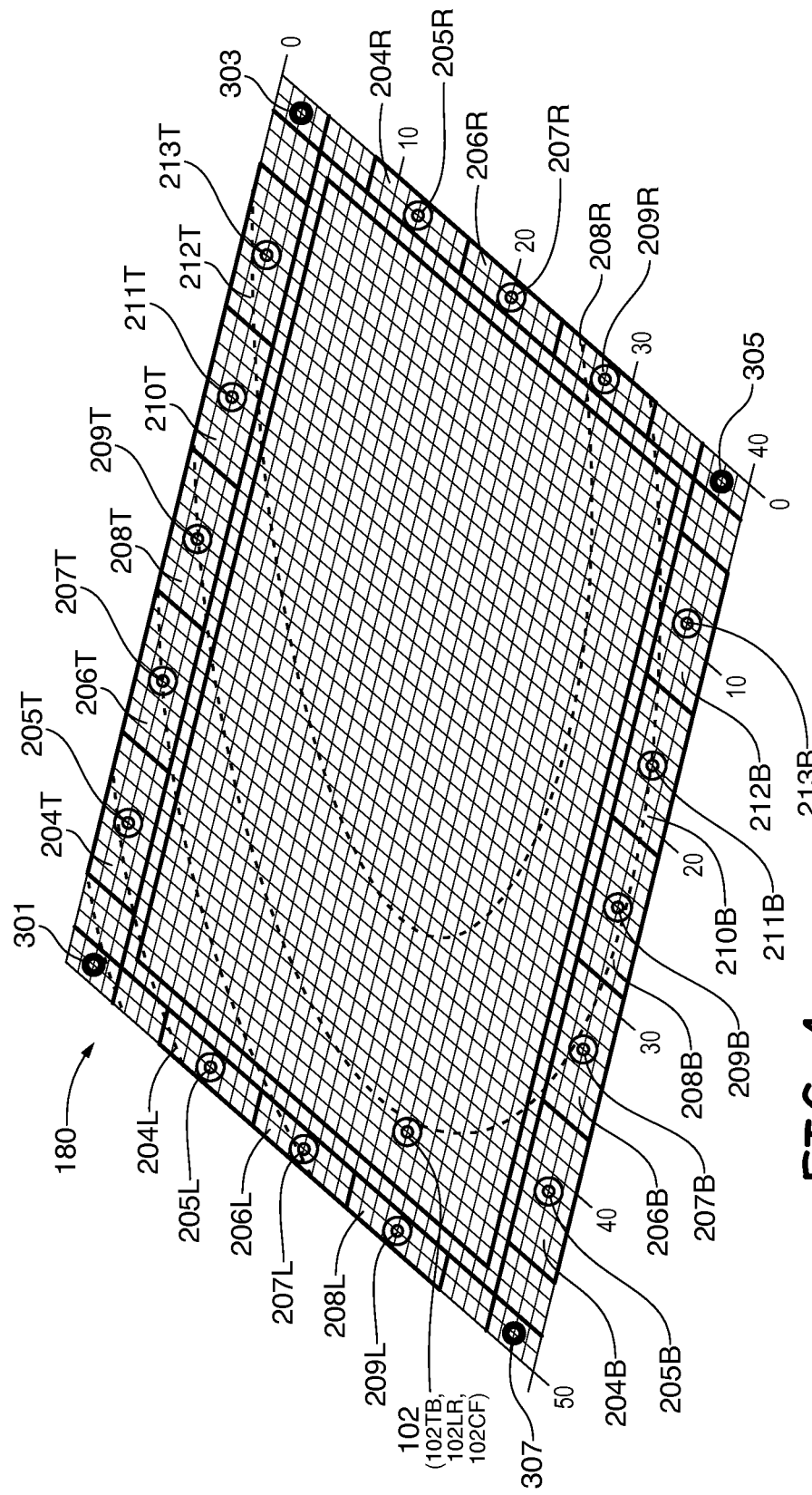
FIG. 4 is a diagram of an illustrative background signal gradient such as the background signal gradient of FIG. 3 in which background signal values generated by optically black pixels are divided into blocks having block average background signal values in accordance with an embodiment of the present invention.

A flattened perspective of gradient 180 is shown in FIG. 4. In the illustrative example of FIG. 4, the background signal values 202 of gradient 180 have been divided into multiple blocks. As shown in FIG. 4, the background signal values 202 generated by the optically black pixels 200 formed along a top edge of the pixel array 18 have been divided into five blocks 204T, 206T, 208T, 210T, and 212T. Each of the five blocks includes thirty-two background signal values 202 generated by thirty-two optically black pixels 200 formed along the top edge of pixel array 18. This, however, is merely illustrative. Background signal values 202 generated by optically black pixels 200 may be divided into any suitable number of blocks of any suitable size containing any suitable number of background signal values 202. In one suitable example, the background signal values 202 generated by the optically black pixels 200 at a top edge of pixel array 18 may be divided into two blocks, three blocks, four blocks, five blocks, six blocks, eight blocks, ten blocks, or any other suitable number of blocks. In one suitable example, background signal values 202 generated by optically black pixels 200 may be broken up into one block per optically black pixel 200 (i.e., the background signal values 202 may be divided into one block per pixel, or may not be broken up into any blocks).

A block average background signal value (sometimes referred to herein as block value, block average, average value, average background signal value, block background signal value, or block average value), may be calculated for each of the five blocks 204T, 206T, 208T, 210T, and 212T. The block average may be calculated by averaging each of the background signal values 202 in any one of the given blocks. For example, block average value 205T may be generated by taking the average of all of the background signal values 202 included in block 204T. A similar process may be used for calculating block average 207T for block 206T, block average 209T for block 208T, block average 211T for block 210T, and block average 213T for block 212T. This, however, is merely illustrative. Block average background signal values may be generated for any number or configuration of blocks that include any suitable number of optically black pixels 200 that generate background signal values 202.

As shown in the illustrative example of FIG. 4, the background signal values 202 generated by the optically black pixels 200 formed along a bottom edge of the pixel array 18 have been divided into five blocks 204B, 206B, 208B, 210B, and 212B. Each of the five blocks includes thirty-two background signal values 202 generated by thirty-two optically black pixels 200 formed along the bottom edge of pixel array 18. This, however, is merely illustrative. Background signal values 202 generated by optically black pixels 200 may be divided into any suitable number of blocks of any suitable size containing any suitable number of background signal values 202. In one suitable example, the background signal values 202 generated by the optically black pixels 200 at a bottom edge of pixel array 18 may be divided into two blocks, three blocks, four blocks, five blocks, six blocks, eight blocks, ten blocks, or any other suitable number of blocks. In one suitable example, background signal values 202 generated by optically black pixels 200 may be broken up into one block per optically black pixel 200 (i.e., the background signal values 202 may be divided into one block per pixel, or may not be broken up into any blocks).

A block average background signal value may be calculated for each of the five blocks 204B, 206B, 208B, 210B, and 212B. The block average may be calculated by averaging each of the background signal values 202 in any one of the given blocks. For example, block average 205B may be generated by taking the average of all of the background signals 202 included in block 204B. A similar process may be used for calculating block average 207B for block 206B, block average 209B for block 208B, block average 211B for block 210B, and block average 213B for block 212B. This, however, is merely illustrative. Block average background signal values may be generated for any number or configuration of blocks that include any suitable number of optically black pixels 200 that generate background signal values 202.

As shown in the illustrative example of FIG. 4, the background signal values 202 generated by the optically black pixels 200 formed along a left edge of the pixel array 18 have been divided into three blocks 204L, 206L, and 208L. Each of the three blocks includes sixteen background signal values 202 generated by sixteen optically black pixels 200 formed along the left edge of pixel array 18. This, however, is merely illustrative. Background signal values 202 generated by optically black pixels 200 may be divided into any suitable number of blocks of any suitable size containing any suitable number of background signal values 202. In one suitable example, the background signal values 202 generated by the optically black pixels 200 at a left edge of pixel array 18 may be divided into two blocks, three blocks, four blocks, five blocks, six blocks, eight blocks, ten blocks, or any other suitable number of blocks. In one suitable example, background signal values 202 generated by optically black pixels 200 may be broken up into one block per optically black pixel 200 (i.e., the background signal values 202 may be divided into one block per pixel, or may not be broken up into any blocks).

A block average background signal value may be calculated for each of the three blocks 204L, 206L, and 208L. The block average may be calculated simply by averaging each of the background signal values 202 in any one of the given blocks. For example, block average 205L may be generated by taking the average of all of the background signals 202 included in block 204L. A similar process may be used for calculating block average 207L for block 206L and for block average 209T for block 208L. This, however, is merely illustrative. Block average background signal values may be generated for any number or configuration of blocks that include any suitable number of optically black pixels 200 that generate background signal values 202.

As shown in the illustrative example FIG. 4, the background signal values 202 generated by the optically black pixels 200 formed along a right edge of the pixel array 18 have been divided into three blocks 204R, 206R, and 208R. Each of the three blocks includes sixteen background signal values 202 generated by sixteen optically black pixels 200 formed along the right edge of pixel array 18. This, however, is merely illustrative. Background signal values 202 generated by optically black pixels 200 may be divided into any suitable number of blocks of any suitable size containing any suitable number of background signal values 202. In one suitable example, the background signal values 202 generated by the optically black pixels 200 at a right edge of pixel array 18 may be divided into two blocks, three blocks, four blocks, five blocks, six blocks, eight blocks, ten blocks, or any other suitable number of blocks. In one suitable example, background signal values 202 generated by optically black pixels 200 may be broken up into one block per optically black pixel 200 (i.e., the background signal values 202 may be divided into one block per pixel, or may not be broken up into any blocks).

A block average background signal value may be calculated for each of the three blocks 204R, 206R, and 208R. The block average may be calculated simply by averaging each of the background signal values 202 in any one of the given blocks. For example, block average 205R may be generated by taking the average of all of the background signals 202 included in block 204R. A similar process may be used for calculating block average 207R for block 206R and for block average 209R for block 208R. This, however, is merely illustrative. Block average background signal values may be generated for any number or configuration of blocks that include any suitable number of optically black pixels 200 that generate background signal values 202.

Block average background signal values may be generated for regions 300 in pixel array 18. As described above in connection with FIG. 2, regions 300 in pixel array 18 may contain no pixels. Block average background signal values (sometimes referred to herein as block averages, corner region averages, corner region background signal values, corner background signal values, corner region block averages, background signal values, or corner background signal values) 301, 303, 305, and 307 for regions 300 may be extrapolated based on the block average background signal values generated for blocks of background signal values 202. In one suitable scenario, background signal value 301 may be extrapolated based on block averages that correspond to the optically black pixels 200 formed along an edge of pixel array 18. For example, block average 301 may be calculated by linear extrapolation using one or more block averages 205T, 207T, 209T, 211T, and 213T. In one suitable example, block average 301 may be calculated using linear extrapolation based on the block averages 205L, 207L, and 209L. In one illustrative scenario, block average 301 may be calculated using combined extrapolation calculations, such as, for example, combined linear extrapolation using the block averages 205T, 207T, 209T, 211T, and 213T and the block averages 205L, 207L, and 209L. These examples, however, are merely illustrative. Block averages 301, 303, 305, and 307 may be calculated using any suitable means or method of extrapolation based on any suitable values generated by or for any pixels or pixel blocks in or associated with pixel array 18.

Background signal values 102 (i.e., estimates of the background signals generated by image pixels 100) may be calculated based on the block average background signal values generated based on the block background signal values. Background signal value 102 may represent the background signal generated by a single pixel 100 in pixel array 18. As shown in the illustrative example of FIG. 4, a background signal value 102 may be calculated based on the block average background signal values. For example, a first background signal value 102TB may be calculated based on block averages 301, 307, 205T, and 205B. As shown in the illustrative example of FIG. 4, block averages 301, 307, 205T, and 205B may form the four corners of a rectangle in which background signal value 102TB in gradient 180 lies. In such an example, bilinear interpolation based on block averages 301, 307, 205T, and 205B may be used to generate a top-bottom background signal value 102TB. Such a top-bottom background signal value 102TB is calculated using block averages 205T and 205B (calculated based on the background signal values 202 contained in blocks 204T and 204B, respectively) that represent background signals generated by optically black 200 formed along the top and bottom respective edges of pixel array 18. In the illustrative example of FIG. 4, top-bottom background signal value 102TB is calculated using two block averages 301 and 307 calculated for corner regions 300 in pixel array 18. This, however, is merely illustrative. Using bilinear interpolation, any background signal value 102 for any image pixel 100 may be calculated based on four block average background signal values that form the four corners of a rectangle in which background signal value 102 lies on gradient 180. For example, a top-bottom background signal value 102TB may be calculated based on block averages 209T, 211T, 209B, and 211B if background signal value 102 lies on gradient 180 such that background signal value 102 is contained within the rectangle having four corners formed by block averages 209T, 211T, 209B, and 211B.

A second background signal value 102LR may be calculated based on block averages 207L, 209L, 207R, and 209R. As shown in the illustrative example of FIG. 4, block averages 207L, 209L, 207R, and 209R may form the four corners of a rectangle in which background signal value 102LR in gradient 180 is contained. In such an example, bilinear interpolation based on block averages 207L, 209L, 207R, and 209R may be used to generate a left-right background signal value 102. Such a left-right background signal value 102LR is calculated using block averages 207L, 209L, 207R, and 209R (calculated based on the background signal values 202 contained in blocks 206L, 208L, 206R, and 208R respectively) that represent background signals generated by optically black pixels 200 formed along the left and right respective edges of pixel array 18. In the illustrative example of FIG. 4, left-right background signal value 102LR is calculated using four block averages 207L, 209L, 207R, and 209R calculated for blocks 206L, 208L, 206R, and 208R. This, however, is merely illustrative. Using bilinear interpolation, any background signal value 102 for any image pixel 100 may be calculated based on four block average background signal values that form the four corners of a rectangle in which background signal value 102 lies on gradient 180. For example, a left-right background signal value 102LR may be calculated based on block averages 301, 303, 205L, and 205R if background signal value 102 lies on gradient 180 in a position such that background signal value 102 is contained within the rectangle having four corners formed by block averages 301, 303, 205L, and 205R.

A third background signal value 102CF may be calculated based on block averages 301, 303, 305, and 307. As shown in the illustrative example of FIG. 4, block averages 301, 303, 305, and 307 may form the four corners of a rectangle in which background signal value 102 in gradient 180 lies. In such an example, bilinear interpolation based on block averages 301, 303, 305, and 307 may be used to generate a corner-fix background signal value 102CF. Such a corner-fix background signal value 102CF may be calculated using block averages 301, 303, 305, and 307 (calculated for corner regions 300 based on the block averages of background signal values 202).

Multiple background signal values 102 in gradient 180 may be calculated based on the block average background signal values. For example, background signal values 102 may be calculated for multiple different image pixels 100 in pixel array 18. In one illustrative example, every background signal value 102 in gradient 180 may be calculated based on the block average background signal values. In such an illustrative example, a top-bottom background signal value 102TB may be calculated using bilinear interpolation based on the four block averages (i.e., two of block average background pixel values 205T, 207T, 209T, 211T, and 213T and two of block average background pixel values 205B, 207B, 209B, 211B, and 213B) that form the corners of a rectangle in which background signal value 102 lies in gradient 180. As described above, block averages 301, 303, 305, and/or 307 corresponding to corner regions 300 may form at least two of the corners a rectangle in which background signal value 102 lies, and may be used in calculating a top-bottom background signal value 102. A left-right background signal value 102LR may be calculated using bilinear interpolation based on the four block averages (i.e., two of block average background pixel values 205L, 207L, and 209L and two of block average background pixel values 205R, 207R, and 209R) that form the corners of a rectangle in which background signal value 102 lies in gradient 180. As described above, block averages 301, 303, 305, and/or 307 corresponding to corner regions 310 may form at least two of the corners of a rectangle in which background signal value 102 lies, and may be used in calculating a left-right background signal value 102. A corner-fix background signal value 102CF may be calculated using bilinear interpolation based on the four block averages 301, 303, 305, and 307 (calculated for corner regions 300 based on the block average pixel values) that form the corners of a rectangle in which background signal value 102 lies in gradient 180.

As described above, a top-bottom background signal value 102TB, a left-right background signal value 102LR, and a corner-fix background signal value 102CF may be calculated for every image pixel 100 in array 18. Therefore, each image pixel 100 in pixel array 18 for which a background signal value 102 is calculated may have three separate component background signal values. A top-bottom background signal value 102TB (i.e., a first estimate component), a left-right background signal value 102LR (i.e., a second estimate component), and a corner-fix background signal value 102CF (i.e., a third estimate component) may be used to calculate a composite background signal value 102 (sometimes referred to herein as image pixel background signal value 102, image sensor pixel background signal value 102, or background signal 102). For example, composite background signal value 102 may be calculated by adding top-bottom background signal value 102TB and left-right background signal value 102LR, and then subtracting corner-fix background signal value 102CF from the sum. Subtracting corner-fix background signal 102CF from the sum of top-bottom background signal value 102TB and left-right background signal value 102LR may help correct for increases or decreases in block average background signal values along the edges of gradient 180 that are accounted for in both the top-bottom background signal value 102 and the left-right background signal value 102. For a background signal value 102 calculated for an image pixel 100 located near a corner region 300 in pixel array 18, for example, the extrapolated block average background signal value calculated for the corner region 300 may be used in calculating both the left-right background signal value 102 and the top-bottom background signal value 102 for that pixel. Subtracting corner-fix background signal value 102CF from the sum of the left-right background signal value 102LR and the top-bottom background signal value 102TB may help prevent background signal value 102 from being estimated as disproportionately large or small due to the corner region block averages that are taken into account during calculation of both the left-right background signal value 102LR and the top-bottom background signal value 102TB.

The steps described above in connection with calculating a background signal value 102 are, however, merely illustrative. For example, a background signal value 102 may be calculated based on any number of component background signal values such as 102TB, 102LR, and 102CF. Furthermore, such component background signal values 102TB, 102LR, and 102CF may be calculated based on any combination of background signal values 202 and/or block average background signal values calculated based on background signal values 202. The example described above in which each background signal value is calculated using four block averages that form the four corners of a rectangle is merely illustrative. Background signal values may be calculated using any suitable number of background signal values 202 and/or block averages arranged in any suitable configuration with respect to a background signal value 102 that is being calculated. Background signal values 102 may be calculated using any number of component background signal values calculated by any suitable means. For example, background signal value 102 may be calculated based on one, two, three, four, or more component background signal values calculated using any suitable means based on any suitable number and/or configuration of background signal values 202 and/or block averages calculated therefrom. The example in which bilinear interpolation is used to calculate background signal values 102 based on four block averages are merely illustrative. For example, any suitable method, calculation, algorithm, equation, or other means may be used to generate background signal values 102 based on background signal values 202 and/or the block averages calculated therefrom.

Each pixel 100 in pixel array 18 may generate a different background signal (e.g., based on dark current and noise) and may therefore have a different background signal value 102. A given image pixel 100 may generate a digital image pixel readout value having a background signal value component (due to dark current and noise, for example) and an image signal value (generated in response to light received at the pixel array, for example). Background signal value 102 may be an estimate of the background signal value component of the digital image pixel readout value based on the background signal values 202 measured using the optically black pixels 200 formed along the edges of pixel array 18. By using optically black pixels 200 formed along the edges of pixel array 18, background signals generated by pixels in pixel array 18 (i.e., image pixels) may be estimated. Because optically black pixels 200 are formed on pixel array 18, variations in background signals generated by pixels in pixel array 18 due to the location of the pixels in the array 18 may be reflected in background signal values 202 (e.g., due to fluctuations in dark current generation due to temperature gradients on pixel array 18). By using bilinear interpolation to estimate the background signal values 102 for image pixels 100 in pixel array 18, estimates of the background signal value component of the digital image pixel readout values generated by image pixels 100 may be calculated.

Figure 5:
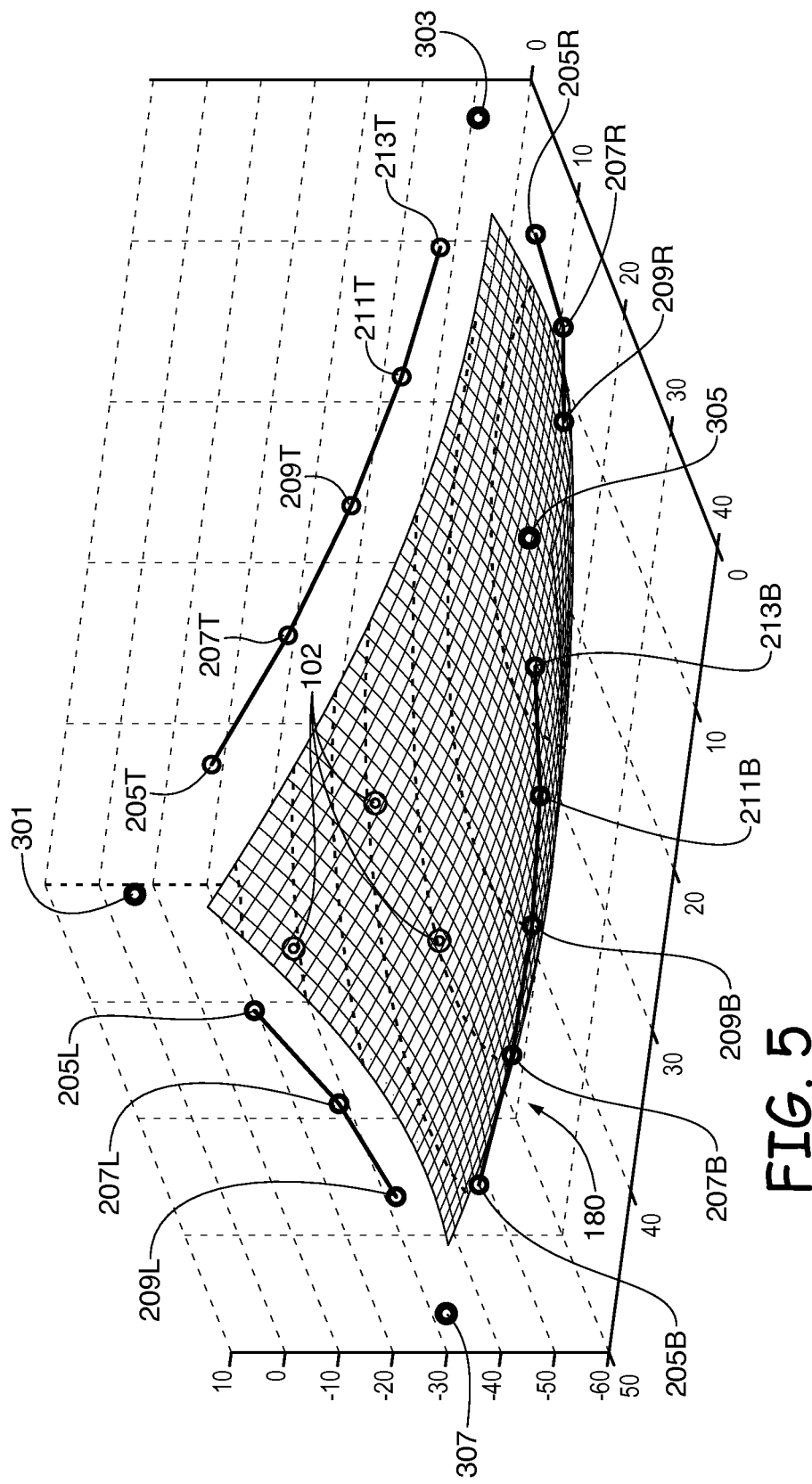
FIG. 5 is a diagram of an illustrative background signal gradient such as the background signal gradient of FIG. 3 and the block average background signal values of FIG. 4 in accordance with an embodiment of the present invention.

FIG. 5 shows an illustrative background signal value gradient 180 and block signal values generated based on background signal values 202. In the illustrative example of FIG. 5, a background signal value 102 has been calculated for every image sensing pixel 100 in pixel array 18 (using, for example, bilinear interpolation based on the block average background signal values generated using background signal values 202, as described above in connection with FIG. 4). In the illustrative example of FIG. 5, the background signal values 102 form a gradient 180. Gradient 180 may contain background signal values 102 having different values and may represent the different background signals generated by image pixels 100 in pixel array 18. For example, a pixel 100 may be formed on a portion of pixel array 18 that has an increased temperature (due to, for example, nearby circuitry such as pixel control and readout circuitry 20 and/or storage and processing circuitry 22) and may therefore operate at the increased temperature. An increased operating temperature may cause image pixel 100 to generate increased dark current or noise that leads to generation of a higher background signal. Because background signal value 102 is calculated based on background signal values 202 that are generated by optically black pixels 200 and that may produce only background signal (that may, for example, reflect temperature gradients on pixel array 18), the background signal value 102 calculated for a pixel 100 may be representative of the background signal generated by the pixel 100.

By calculating a background signal value 102 for each of the pixels 100 in pixel array 18, the background signal value contribution included in the image pixel readout values generated by image pixels 100 (i.e., the readout signals generated by image pixels 100 when light is received at an image pixel 100) may be determined. Background signal values 102 may be used as correction factors that are subtracted from the image pixel readout values to generate background signal-corrected image pixel values. Background signal-corrected image pixel values may be used to generate a digital image that has a reduced background signal component.

In the illustrative examples described above, five blocks 204T, 206T, 208T, 210T, and 212T are formed based on background signal values 202 generated by optically black pixels 200 formed along a top edge of pixel array 18 to generate five block averages 205T, 207T, 209T, 211T, and 213T. Similar arrangements are generated based on optically black pixels formed along the bottom, left, and right edges of pixel array 18. These block average pixel values are then used to generate the background signal values 102 that form gradient 180. This, however, is merely illustrative. For example, more or less blocks may be formed based on the background signal values 202 generated by the optically black pixels 200 on the edges of pixel array 18, resulting in more or less block average background signal values being generated. In one illustrative example, more block averages may be generated based on more blocks. In such an illustrative example, the background signal values 102 may be estimated based on background signal values 202 generated by optically black pixels 200 that are formed in a location on pixel array 18 that is closer to the location of the image pixel 100 for which the background signal 102 is being calculated (i.e., the block averages used to calculate background signal 102 may form four corners of a rectangle that are closer together). In such an example, background signal 102 may be calculated with higher accuracy and may be a more accurate estimation of the background signal value component in the readout signal generated by image pixel 100.

In one suitable scenario, less block average background signal values may be generated based on less blocks. In such an illustrative example, the background signal values 102 determined based on background signal values 202 from optically black pixels 200 that are formed in a location on pixel array 18 that is farther from the location of the image pixel 100 for which the background signal 102 is being calculated (i.e., the block averages used to calculate background signal 102 may form four corners of a rectangle that are farther apart). In such an example, background signal 102 may be a more general estimation of the background signal component in the readout signal generated by image pixel 100. Such a background signal value 102 may be estimated using less processing power and may be generated more quickly than a background signal value 102 calculated based on more block averages.

Background signal gradient 180 and image pixel background signal values 102 may be generated at any suitable time. For example, background signal gradient 180 may be generated at the same time that image sensor 16 captures a frame of image data (e.g., in response to light that is incident upon pixel array 18). In such an illustrative example, gradient 180 may reflect the background signals generated by image pixels 100 at the time that the image is captured by the image sensor, and may allow for background signal correction using background signal values 102 that have increased accuracy. In one suitable scenario, gradient 180 may be generated in advance of an image being captured by image sensor 16. In such an example, gradient 180 may be generated when a previous frame of image data is captured by image sensor 16, or may be a gradient 180 that represents background signal (i.e., noise and/or dark current) generated by image pixels 100 at the time of manufacture. Such a gradient may allow for the background signal contributions of the image pixel readout signals to be compensated for without having to generate a new gradient for every image captured by image sensor 16. In such an example, background signal gradient 180 and image pixel background signal values 102 may be stored on imaging system 10 (in, for example, storage and processing circuitry 22) until background signal gradient 180 is ready to be applied to image pixel readout values (e.g., a frame of image data) generated by image sensor 16 in response to light that is received at pixel array 18.

Gradient 180 may be generated in response to changes that occur on or in pixel array 18. For example, imaging system 10 may be provided with temperature sensor pixels or other sensors that are able to determine the temperature on or near at least a portion of pixel array 18. Temperature sensor pixels may be optically black pixels 200 configured to detect the temperature of pixel array 18 based on the dark current that they generate, or may be any other suitable pixel configured to detect temperature. In response to changes in the temperature of pixel array 18 that may cause changes in the dark current and/or noise (i.e., background signal) generated by image pixels 100 in pixel array 18, a new gradient 180 may be calculated to provide an accurate representation of the background signals generated by image pixels 100 at that time. These background signal values 102 may provide an accurate representation of the background signal contributions in the image pixel readout signals generated by image pixels 100 as the temperature of pixel array 18 changes. This, however, is merely illustrative. Gradient 180 may be generated or re-generated at any suitable time or in response to any suitable signal indicative of any suitable change in imaging system 10. Gradient 180 may be generated for every image captured by image sensor 16, for multiple images captures by image sensor 16, for one image captured by image sensor 16, or may be generated before any images have been captured by image sensor 16 (e.g., gradient 180 need not be generated in response to an image being captured).

Figure 6:
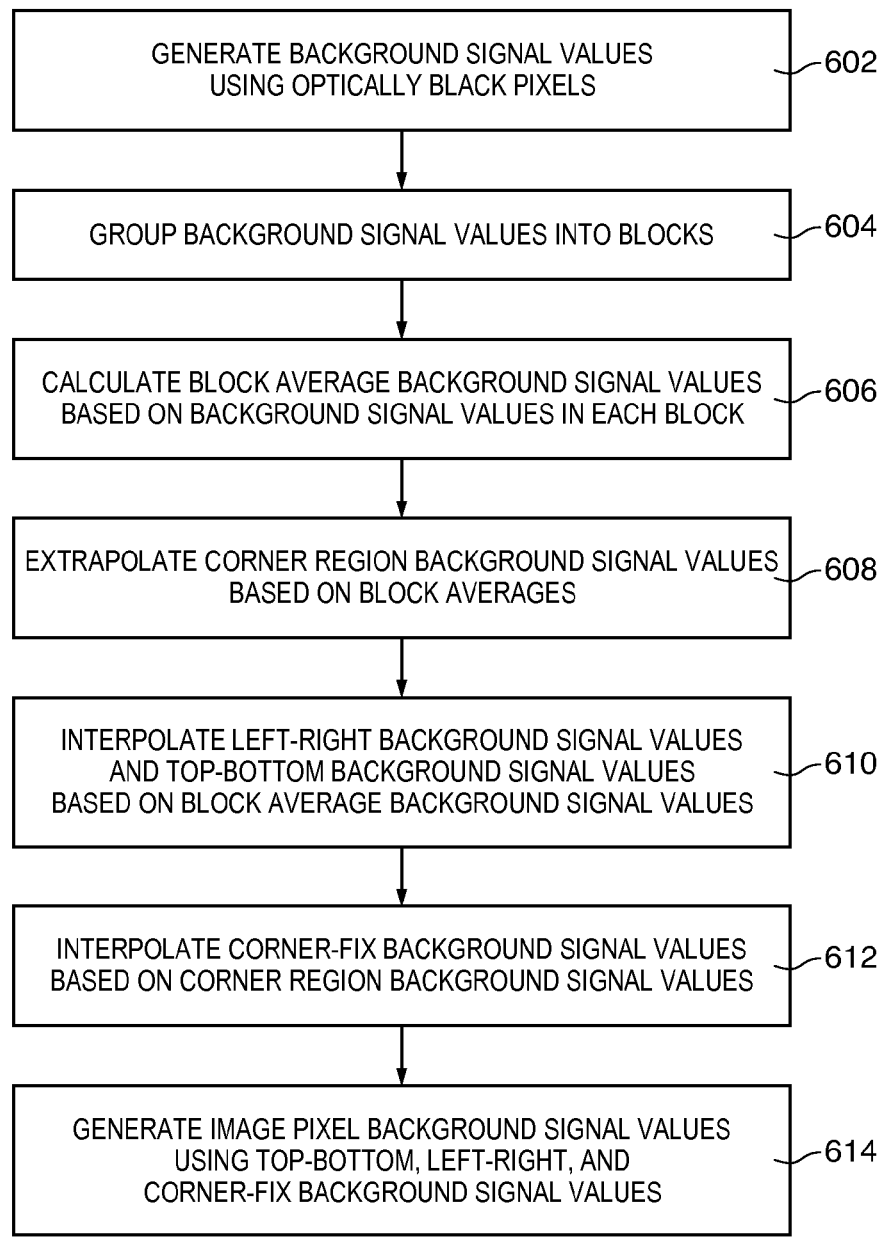
FIG. 6 is a flow chart of illustrative steps that may be performed to determine background signal values generated by image pixels in in a pixel array in accordance with an embodiment of the present invention.

FIG. 6 is a flow chart of illustrative steps that may be performed to determine background signal values such as background signal values 102 generated by image pixels such as image pixels 100 in in a pixel array such as pixel array 18.

At step 602, background signal values such as background signal values 202 may be generated by optically black pixels 200. Optically black pixels 200 may be formed in an edge region of pixel array 18 and may be configured to generate only background signals (e.g., optically black pixels 200 may not receive light and/or may not generate any photocurrent or signal in response to received light).

At step 604, background signal values 202 may be grouped into blocks. Background signal value blocks may contain one or more background signal values 202 generated by one or more optically black pixels 200. The background signal values 202 included in a block may be background signal values generated by optically black pixels 200 that are formed in the same portion of pixel array 18 (e.g., blocks may be formed of groups of adjacent pixels).

At step 606, block averages may be calculated for each of the blocks based on the background signal values 202 included in each block. Block averages may be calculated by averaging the background signal values 202 included in each block.

At step 608, corner region background signal values may be extrapolated based on the block averages calculated for the blocks. Corner region background signal values may be generated for corner regions 300 that do not contain image pixels 100 or optically black pixels 200. In one illustrative example, corner regions 300 may include pixels such as image pixels 100 and/or optically black pixels 200, and corner region background signal values may not be calculated by extrapolation. In such an example, corner regions 300 may include optically black pixels 200 that generate background signal values 202 that are used to generate a block average background signal value for corner region 300 rather than or in addition to extrapolating a corner region background signal value for corner region 300.

At step 610, top-bottom background signal values may be generated using block averages calculated based on background signal values generated by optically black pixels formed along the top and bottom edges of pixel array 18. Left-right background signal values may be generated using block average background signal values calculated based on background signal values generated by optically black pixels formed along the left and right edges of pixel array 18. The top-bottom background signal values and left-right background signal values may be interpolated based on the block average background signal values (e.g., top-bottom and left-right background signal values may be generated using bilinear interpolation).

At step 612, corner-fix background signal values may be generated based on corner region background signal values calculated for the corner regions 300 of pixel array 18. The corner-fix background signal values may be interpolated based on the corner region background signal values (e.g., corner-fix background signal values may be generated using bilinear interpolation).

At step 614, top-bottom, left-right, and corner-fix background signal values may be used to estimate image pixel background signal values. For example, an image pixel background signal value for an image pixel in pixel array 18 may be generated by subtracting a corner-fix background signal value from the sum of a top-bottom background signal value and a left-right background signal value. An image pixel background signal value may be generated for one or more (e.g., every) image pixel in pixel array 18.

Figure 7:
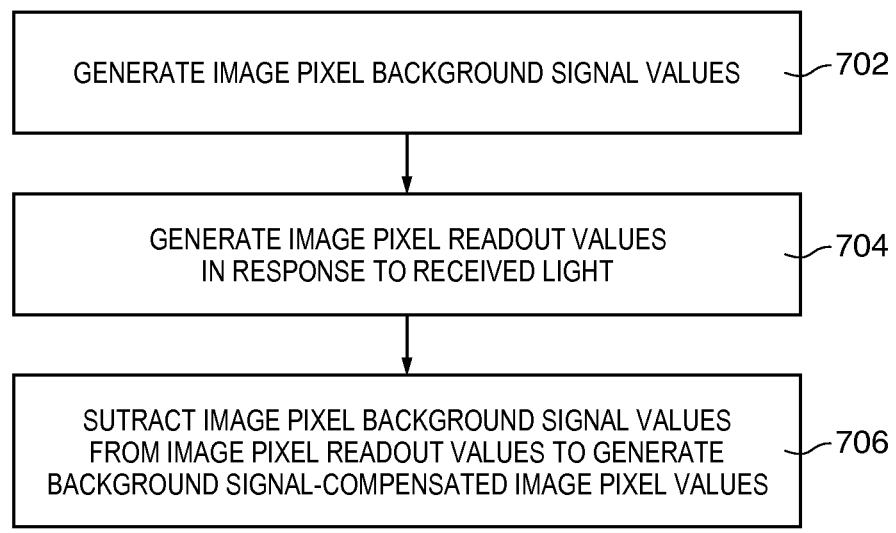
FIG. 7 is a flow chart of illustrative steps that may be performed to compensate for background signal generated by image pixels in a pixel array in accordance with an embodiment of the present invention.

FIG. 7 is a flow chart of illustrative steps that may be performed to compensate for background signals generated by image pixels such as image pixels 100 in a pixel array such as pixel array 18.

At step 702, image pixel background signal values may be generated. For example, image pixel background pixel values may be background signal values 102 generated for every image pixel 100 in pixel array 18, as described above in connection with FIG. 6.

At step 704, image pixel readout values may be generated in response to light that is received by image pixels 100 in pixel array 18. For example, image pixels 100 may generate image pixel readout values having a background signal value component (due to, for example, dark current and/or noise generated by image pixels 100) and an image pixel value component (generated in response to the light incident upon the pixel array 18, for example). In one suitable example, readout values may be generated before image pixel background signal values are generated (i.e., image pixel background signal values may be generated in after image sensor 16 captures a frame of image data). In one suitable example, image pixel readout values may be generated after image pixel background signal values are generated (e.g., image pixel background signal values may be generated in response to a previous image captured by image sensor 16 or may be generated during a manufacturing process used in manufacturing imaging system 10).

At step 706, background signal-compensated image pixel values may be generated by subtracting the image pixel background signal values from the image pixel readout values. Background signal-compensated image pixel values may have reduced background signal value contributions when compared to image pixel readout values and may produce digital images having reduced noise and undesirable image artifacts.

A method for determining background noise in a frame of image data may include receiving the frame of image data from an image sensor having an array of image pixels and a plurality of optically black pixels. The frame of image data may include first background signal values from the optically black pixels. The method may include grouping the first background signal values into blocks, calculating block average values based on the first background signal values included in each respective block, and determining second background signal values for the image pixels in the array based on the block averages. The second background signal values may indicate an amount of background noise associated with the image pixels.

If desired, the second background signal values may be determined using bilinear interpolation of the first background signal values.

If desired, corner background signal values may be generated for corner regions of the pixel array based on the block average values. The corner regions of the pixel array may be free of image pixels and optically black pixels. The corner background signal values may be extrapolated based on the block average values. The second background signal values may be determined based on the block average values and the corner background signal values.

If desired, the optically black pixels may be formed in a border around the array having first and second opposing edges and third and fourth opposing edges. The first background signal values from the optically black pixels formed in each of the respective first, second, third, and fourth edges may be grouped into at least respective first, second, third, and fourth blocks. Respective first, second, third, and fourth block average values may be calculated for each of the respective first, second, third, and fourth blocks. For at least one of the image pixels, a first component background signal value may be generated based on the first and second block average values, and a second component background signal value may be generated based on the third and fourth block average values. A third component background signal value may be generated based on corner background signal values generated for corner regions of the array. The corner background signal values may be generated based on the block average values. The second background signal value may be determined by subtracting the third composite background signal value from a sum of the first and second composite background signal values.

A method of removing background signals generated by image pixels in a pixel array may include determining a background signal estimate for an image pixel in the pixel array based on background signal values from optically black pixels arranged in a border around the pixel array, receiving an image pixel readout value generated by the image pixel in response to light that is received at the pixel array, and calculating a background signal-compensated image pixel value using the background signal estimate and the image pixel readout value.

If desired, determining the background signal estimate may include determining the background signal values using the optically black pixels. The background signal values may indicate dark current generated by the optically black pixels. Determining the background signal estimate may include grouping the background signal values from adjacent optically black pixels into blocks, calculating block averages based on the background signal values included in the respective blocks, and determining the background signal estimate for the image pixel based on the block averages.

If desired, the image pixel readout value may include an image signal value component generated in response to the light that is received at the pixel array and a background signal value component generated in response to dark current generated by the image pixel. The image pixel background signal value may be an estimate of the background signal value component in the image pixel readout value.

If desired, determining the background signal estimate may include interpolating a first estimate component based on a first set of the block averages, interpolating a second estimate component based on a second set of the block averages, and interpolating a third estimate component based on a third set of block averages. The first, second, and third sets of block averages may be different, and the background signal estimate may be determined based on the first, second, and third estimate components.

If desired, the third set of block averages may be used to extrapolate corner background signal values for corners of the pixel array. The third estimate component may be generated based on the corner background signal values.

If desired, the background signal estimate may be determined using bilinear interpolation of the background signal values.

A method for applying a background signal gradient to image data generated by pixels in an array may include generating a frame of image data in response to light received at the array with a first plurality of image pixels, generating background signal values with a second plurality of pixels that do not receive light, grouping the background signal values into blocks that may include background signal values generated by the second plurality of pixels, calculating block averages for each of the respective blocks based on the background signal values in each of the respective blocks, and interpolating additional background signal values for the first plurality of pixels based on the block averages. The additional background signals may form a background signal gradient. The background signal gradient may be applied to the frame of image data.

If desired, the image data may include readout signal values, and applying the background signal gradient to the frame of image data may include subtracting the additional background signal values from readout signal values generated by the first plurality of pixels.

If desired, the background signal gradient may be applied to a plurality of additional frames of image data generated after the frame of image data.

If desired, the background signal values may be generated in response to a change in temperature of the array.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for correcting for background noise in a frame of image data, the method comprising:
   receiving the frame of image data from an image sensor having an array of image pixels and a plurality of optically black pixels, wherein the frame of image data includes first background signal values from the optically black pixels;
   grouping the first background signal values into blocks;
   calculating block average values based on the first background signal values included in each respective block;
   determining second background signal values for the image pixels in the array based on the block averages, wherein the second background signal values indicate an amount of background noise associated with the image pixels;
   generating corner background signal values for corner regions of the pixel array based on the block average values, wherein the corner regions of the pixel array are free of image pixels and optically black pixels; and
   applying the second background signal values to the frame of image data.

2. The method defined in claim 1, wherein the second background signal values are determined using bilinear interpolation of the first background signal values.

3. The method defined in claim 1, wherein the corner background signal values are extrapolated based on the block average values.

4. The method defined in claim 1, wherein the second background signal values are determined based on the block average values and the corner background signal values.

5. The method defined in claim 1, wherein the optically black pixels are formed in a border around the array having first and second opposing edges and third and fourth opposing edges.

6. The method defined in claim 5, wherein the first background signal values from the optically black pixels formed in each of the respective first, second, third, and fourth edges are grouped into at least respective first, second, third, and fourth blocks, and wherein respective first, second, third, and fourth block average values are calculated for each of the respective first, second, third, and fourth blocks.

7. The method defined in claim 6, further comprising:
   for at least one of the image pixels, generating a first component background signal value based on the first and second block average values, and generating a second component background signal value based on the third and fourth block average values.

8. The method defined in claim 7, wherein the second background signal value is determined by subtracting a corner background signal value of the corner background signal values from a sum of the first and second composite background signal values.

9. The method defined in claim 1, wherein the corner regions of the pixel array include traces.

10. A method of removing background signals generated by image pixels in a pixel array, the method comprising:
    determining a background signal estimate for an image pixel in the pixel array based on background signal values from optically black pixels arranged in a border around the pixel array, wherein the pixel array has first and second opposing edges connected by third and fourth opposing edges, wherein the background signal values from the optically black pixels formed in the first edge of the pixel array are grouped into at least respective first, second, third and fourth blocks, and wherein respective first, second, third and fourth block average values are calculated for each of the respective first, second, third and fourth blocks;

receiving an image pixel readout value generated by the image pixel in response to light that is received at the pixel array, and using the background signal estimate to remove the background signals from the image pixel readout value and obtain a background signal-compensated image pixel value.

11. The method defined in claim 10, wherein determining the background signal estimate comprises:

determining the background signal values using the optically black pixels, wherein the background signal values indicate dark current generated by the optically black pixels;

grouping the background signal values from adjacent optically black pixels into blocks;

calculating block averages based on the background signal values included in the respective blocks; and determining the background signal estimate for the image pixel based on the block averages.

12. The method defined in claim 11, wherein the image pixel readout value includes an image signal value component generated in response to the light that is received at the pixel array and a background signal value component generated in response to dark current generated by the image pixel, and wherein the background signal estimate is an estimate of the background signal value component in the image pixel readout value.

13. The method defined in claim 11, wherein determining the background signal estimate comprises:

interpolating a first estimate component based on a first set of the block averages;

interpolating a second estimate component based on a second set of the block averages; and interpolating a third estimate component based on a third set of the block averages, wherein the first, second, and third sets of block averages are different, and wherein the background signal estimate is determined based on the first, second, and third estimate components.

14. The method defined in claim 13, wherein the third set of block averages is used to extrapolate corner background signal values for corners of the pixel array, and wherein the third estimate component is generated based on the corner background signal values.

15. The method defined in claim 10, wherein the background signal estimate is determined using bilinear interpolation of the background signal values.

16. A method for removing background signals from image data generated by pixels in an array, the method comprising:

with a first plurality of pixels, generating a frame of image data in response to light received at the array;

with a second plurality of pixels that do not receive light, generating background signal values;

grouping the background signal values into blocks, wherein the blocks include background signal values generated by the second plurality of pixels;

calculating block averages for each of the respective blocks based on the background signal values in each of the respective blocks;

interpolating additional background signal values for the first plurality of pixels based on the block averages; and applying the additional background signal values to the frame of image data.

17. The method defined in claim 16, wherein the image data includes readout signal values, and wherein applying the additional background signal values to the frame of image data comprises subtracting the additional background signal values from readout signal values generated by the first plurality of pixels.

18. The method defined in claim 16, wherein the additional background signal values are applied to a plurality of additional frames of image data generated after the frame of image data.

* * * * *